United States Patent [19]

Roos

[11] 4,126,466
[45] Nov. 21, 1978

[54] COMPOSITE, MASK-FORMING, PHOTOHARDENABLE ELEMENTS

[75] Inventor: Leo Roos, New Shrewsbury, N.J.

[73] Assignee: E. I. Du Pont de Nemours and Company, Wilmington, Del.

[21] Appl. No.: 679,349

[22] Filed: Apr. 22, 1976

Related U.S. Application Data

[63] Continuation of Ser. No. 490,340, Jul. 22, 1974, abandoned, which is a continuation-in-part of Ser. No. 200,611, Nov. 19, 1971, abandoned, which is a continuation-in-part of Ser. No. 108,577, Jan. 21, 1971, abandoned.

[51] Int. Cl.$^2$ .......................... G03C 1/84; G03C 5/00
[52] U.S. Cl. ................................. 96/84 UV; 96/35.1; 96/38.3; 96/67
[58] Field of Search ................... 96/82, 84 R, 84 UV, 96/44, 68, 115 R, 115 P, 35.1, 38.3, 67, 27 R; 355/133

[56] References Cited

U.S. PATENT DOCUMENTS

| | | | |
|---|---|---|---|
| 2,760,863 | 8/1956 | Plambeck | 96/115 R |
| 3,674,492 | 7/1972 | Goldrick et al. | 96/68 |
| 3,730,717 | 5/1973 | Chu et al. | 96/27 R |
| 3,744,904 | 7/1973 | Loprest et al. | 96/36.2 X |
| 3,877,810 | 4/1975 | Feldstein | 355/133 |

*Primary Examiner*—Edward C. Kimlin

[57] ABSTRACT

A composite, photohardenable element comprising in intimate surface contact (a) a resist layer, photohardenable by exposure to actinic radiation and; (b) a soluble layer comprising a macromolecular organic polymer and at least one ultraviolet absorbent dye or pigment. In the preferred elements, the layers are disposed between and adherent to a cover sheet and a support film, respectively.

7 Claims, No Drawings

COMPOSITE, MASK-FORMING, PHOTOHARDENABLE ELEMENTS

CROSS REFERENCE TO RELATED APPLICATIONS

This application is a continuation of copending application Ser. No. 490,340, filed July 22, 1974, now abandoned, which is a continuation-in-part of copending application Ser. No. 200,611 filed Nov. 19, 1971, now abandoned, which in turn is a continuation-in-part of copending application Ser. No. 108,577 filed Jan. 21, 1971, now abandoned.

BACKGROUND OF THE INVENTION

1. Field of the Invention

This invention relates to new multistrata, photohardenable elements which in one embodiment can be used for preparing image-containing colored masks that are useful for copy preparation and related purposes. Such elements are useful with ultraviolet radiation for exposing and hardening other photohardenable elements.

2. Description of the Prior Art

In both the graphic arts and electronics industry, it has become common practice to use photohardenable elements therein because of their high uniformity, ease of preparation, lower cost and other well known factors. During the process of manufacture, copies must often be made which require the use of so-called "masks". These masks are copied from original "artwork" carefully prepared by draftsmen. One system, for example, prepares a copy of the artwork original on a silver halide lithographic type film. This system is commonly used during the preparation of printed circuits. The silver halide film must then be "bleached" to reduce the image density so that the operator may see through the image to line up the copy while working in photopolymer safelights. The safelight used here is that which masks out the ultraviolet portion of the spectrum toward which the photopolymer resist is sensitive and is usually a yellow color. Under this light, the black, developed silver prevents the operator from seeing through the image to line up the copy. The bleaching process, however, produces a brown color through which the operator may readily see while preparing subsequent copies. This visibility is very important as often the operator must place several image copies, one on top of the other, and the resultant "registry" must be perfect in preparing the subsequent copy. The inherent drawbacks of this system are obvious. There are numerous steps in producing the mask, such as exposure, development, bleaching, washing, etc., all done with silver halide safelights, which, because of the inherent nature of the photographic silver halide system, are different from the photopolymer safelight system. In addition, a defect known as "pin-holes" is common to the silver halide system and subsequent passage of ultraviolet light through these pin-holes produces unwanted exposure in the photopolymer copy. This defect is extremely undesirable in the printed circuit industry and cannot be tolerated. Hence, many masks must sometimes be made in order to produce one which is satisfactory, resulting in great waste and cost. In addition, the bleaching process removes excess silver which is either lost or which must be recovered from the processing solution which adds cost to the system. Finally, after several exposures, the bleached image reverts back to a highly blackened state, preventing the operator from obtaining registry, and the mask must be discarded. Thus, the life of this type mask is shortened by use.

Yet another system uses so-called "photomasks" for the preparation, for example, of integrated circuits by photolithographic techniques. These masks are copied by the process of photoreduction from the original artwork, as taught by Madlen et al. in "Integrated Circuit Engineering Basic Technology", Chapter 3, 4th Edition (1966), published by The Boston Technical Publishers, Inc. The original artwork, termed a "photo master", is prepared 200–1000 times the actual size desired and is zealously protected because of the high cost of preparation. Photomask copies of this original are usually made on, for example, optically clear photographic glass plates coated with a fine grain, high resolution silver halide emulsion, such as the "Lippman" type. Because of the delicate and fragile nature of these masks, only a limited number of copies can be made. In addition, they, too, suffer from pin-hole defects described above. Another type of mask commonly used for this process is taught by George and Seaman in "Photo Methods for Industry", October, 1967, pp. 66–67. These are the "metal-on-glass" type which are usually thin depositions of a Ni-Cr-Fe alloy or chromium on a glass substrate. A photohardenable resist layer is then coated on top and the original "photo master" imaged on this photoresist by known techniques well described in the above reference. The area of the photohardenable layer which is left unhardened is washed off by solvent development and the metal "etched" through to the glass in these areas with special etching solutions such as inorganic acids. The remainder of the hardened photoresist is then removed and the metal image cleaned thoroughly leaving a suitable photomask. The metal mask is far superior to the emulsion mask due to its durability and ability to reproduce the original with greater fidelity. However, their manufacturing cost is very high and the number of steps required to prepare the mask makes their use prohibitive in those areas where cost is a major factor. These metal masks also suffer from pin-hole defects and are also relatively opaque to visible light which makes it difficult to obtain good registry.

SUMMARY OF THE INVENTION

An object of this invention is to provide a novel, composite, photosensitive element, which may be transparent to visible light. Such an element is suitable for making integral masks. The composite element comprises soluble layers in intimate contact, at least one of which contains a substance which absorbs ultraviolet radiation and one of which is a photohardenable resist layer. A further object is to provide an element which is more convenient for use in further copy systems. Still another object is to provide composite elements providing greatly reduced operator handling which reduces costs, while retaining all the characteristics of fidelity and the like of commonly used masks such as those described above, namely, photographic silver halide emulsions and metal layers.

The above objects can be achieved by the composite, photohardenable elements described above which preferably have the following structure:

| Cover or Support Film A | (1) | |
|---|---|---|
| Photohardenable Resist Layer (a) | (2) | Structure |
| Polymer UV Absorbing Layer (b) | (3) | |

| -continued |     |
| --- | --- |
| Cover or Support Film B | (4) |

In the preferred embodiment, the composite film should be essentially transparent to actinic light in the visible region of the spectrum, and should, by reason of the ultraviolet dye or pigment mixed in the polymer layer (b), provide an optical density of at least 1.5 or more to that region of the spectrum used to initiate photohardening, namely, between 200–500 mµ. The photohardenable resist layer and the UV absorbing layer should adhere strongly enough to each other to resist rupture when the cover or support film is stripped from the contiguous surface.

A mask suitable for transparent lithographic work can be provided if support film B adheres more strongly to the UV absorbing layer than cover film A adheres to the photohardenable layer. One exposes the photohardenable layer through cover sheet A, then peels off "A" for wash-off development to leave a suitable mask on support film B.

A suitable photomask can be provided by a reverse adherence factor, that is, support film B adhering less strongly to the UV absorbing layer than cover film A adheres to the photohardenable layer. When "B" is peeled off, the remaining three layers can be laminated to a dimensionally stable and rigid support, for example optical glass.

After lamination and exposure, the cover sheet is removed and solvent development of layer (2) yields the photomask under the resist.

Both elements provide masks possessing all the fidelity and sharpness of currently available systems, yet masks may be produced at substantially lower cost and with considerably less handling by operators. In addition, the elements described herein are transparent to visible light allowing the operator to obtain good registry when reproducing copies from these masks. The relative low cost due to less handling permits more latitude when accidental errors or mistakes occur. Masks can be provided that are relatively free of pinholes and other coating defects associated with silver halide emulsions or metal masks. They are also more resistant to scratches which can occur to the mask during normal handling. In addition, the novel masks are resistant to fading, and thus have a longer life than those silver halide systems described above. The entire system itself is compatible with other photopolymer systems allowing them to be used and handled in relatively bright safelights. This factor is important to the users of photopolymer systems such as those in the printed circuit industry. The new and useful masks can be used under the same safelight system to which they had been subjected to previously.

In another embodiment, both the polymer layer (b) and the resist-forming layer (a) contain UV absorbing dyes or pigments. When exposed through (4), the low intensity UV light will be absorbed in polymer layer (b), but the high intensity UV light will penetrate layer (b) and polymerize layer (a) to a depth which is a function of the intensity of the UV radiation. Such an element is useful as a makeready foil, for example.

DESCRIPTION OF THE PREFERRED EMBODIMENTS

A preferred embodiment of this invention is concerned with novel composite, photohardenable elements comprising (a) A resist layer photohardenable by exposure to actinic radiation in intimate contact with, (b) A layer of a solvent-soluble resin, e.g., polyvinyl acetate containing an ultraviolet radiation absorbing agent in a concentration to provide absorption of at least 99% of actinic radiation in the region of the spectrum from 200–500 mµ, and the layer mixture, when in the form of a thin film or coating, exhibiting an optical density in said actinic radiation of 1.5 or more.

Adhesion of the two layers should be strong enough to resist rupture when the cover sheet or base film is stripped from either one of the intermediate layers. The layers may be coated or laminated together, as known to those skilled in the art. Both layers (a) and (b) are disposed between the support film and cover sheet of polyethylene terephthalate or polyethylene. The support and cover sheets serve to support or to protect both the UV absorbing layer and the photohardenable layer.

At this juncture, the elements described above may be used as a transparent lithographic mask by exposing the photoresist through the cover sheet, removing that protective film, developing the resulting image, and washing out the subsequent polymer layer underneath the image leaving the mask on the support layer nearest the UV absorbing layer. Concurrently, the elements described above may be used as a photomask by first stripping the protective layer from the UV absorbing layer, laminating the remaining three layers to a more rigid or a more dimensionally stable support with the UV absorbing layer nearest said support, then imaging the photoresist layer, removing the protective layer nearest the photoresist layer, and developing as described above, leaving a suitable photomask on said rigid support.

The polymeric, solvent-soluble, ultraviolet radiation absorbing layers useful in this invention use as binders, macromolecular organic polymers that form solid films, e.g., polystyrene, copolymers of vinylidene chloride and acrylonitrile, polyacrylates and polymethacrylates, polyamides, polyvinyl esters, etc. These polymers may have molecular weights ranging from 500–150,000 and should be soluble in solvents or developing solutions commonly used to develop photoresists, such as, for example, methyl chloroform, trichloroethylene, mixed solvents, such as methylisobutylketone-isopropanol and others known to those skilled in the art. This invention is not limited necessarily to those solvents useful for developing photoresists however, but the solvents useful in attacking and removing the polymeric UV-absorbing layer must necessarily be unable to dissolve the hardened areas of the adjacent photopolymerized image. More useful elements are those in which the same solvent is used to develop the photoresist image and to simultaneously dissolve the polymer layer containing the UV absorbing dye or pigment, resulting in less handling.

Any ultraviolet radiation-absorbing agent can be mixed with or dispersed in said solvent-soluble polymer binder or matrix, to produce the subsequent mask. Useful agents are 2,3-dihydroxybenzophenone and 2,2'-dihydroxy-4-methoxy-benzophenone.

Since some photohardenable image-forming layers are also sensitive to actinic radiation just beyond the UV region of the spectrum, and since most UV dyes have rather sharp cut-off points, it is also useful to incorporate yellow or orange dyes, such as Oil Yellow 3G (Colour Index #29) and Luxol® Fast Yellow T (Colour Index #47) with the UV absorbing layer. Alternatively, one may use a single dye which absorbs both in the yellow and in the ultraviolet portion of the spectrum. With respect to the photohardenable layer, the optical density of the ultraviolet absorber/dye/matrix layer in the actinic region should be at least 1.5-5.0 and prevent subsequent passage of actinic radiation in the spectral region which is used to initiate photopolymerization, namely, from about 200-500 mµ. Photohardenable photosensitive compositions and elements useful for making the layer coated over the UV absorber disclosed above, to provide a combination which will produce the dyed image to be used as the mask, are legion in number and include those uniformly crosslinkable photohardenable materials disclosed in Celeste U.S. Pat. Nos. 3,526,504, Sept. 1, 1970, and Celeste 3,469,982, Sept. 30, 1969. These photoresists crosslink when they are exposed to actinic light rich in ultraviolet radiation, as taught in the above reference, and form a hard, polymeric surface in those exposed regions. Suitable free-radical initiated chain-propagating addition polymerizable ethylenically unsaturated compounds include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Pat. No. 2,927,022, issued Mar. 1, 1960, e.g. those having a plurality of addition polymerizable ehtylenic linkages, particularly when present as terminal linkages, and especially those wherein at least one and preferably most of such linkages are conjugated with a doubly bonded carbon, including carbon doubly bonded to carbon and to such hetero-atoms as nitrogen, oxygen and sulfur. Outstanding are such materials wherein the ethylenically unsaturated groups, especially the vinylidene groups, are conjugated with ester or amide structures. The following specific compounds are further illustrative of this class; unsaturated esters of alcohols, preferably polyols and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,3-pentanediol dimethacrylate, the bis-acrylates and methacrylates of polyethylene glycols of molecular weight 200-500, and the like; unsaturated amides, particularly those of the alpha-methylene carboxylic acids, and especially those of alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis (gamma-methacrylamidopropoxy) ethane beta-methacrylamidoethyl methacrylate, N-(betahydroxyethyl)-beta-(methacrylamido)ethyl acrylate and N,N-bis(beta-methacryiyloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamides wherein the molecular chain between the hydroxyls and amino groups is solely carbon or oxygen-interrupted carbon. The preferred monomeric compounds are difunctional, but monofunctional monomers can also be used. In addition, the polymerizable, ethylenically unsaturated polymers of Burg U.S. Pat. Nos. 3,043,805, Martin 2,929,710 and similar materials may be used alone or mixed with other materials. Other resist or resist-like layers useful in this invention are described by J. Kosar in "Light-Sensitive Systems", 1965, published by John Wiley and Sons. These include the so-called "cinnamates" as described on page 140 et seq. of the above reference, dichromated colloids as described in Chapter 2 and diazo-type processes as described in Chapter 7 of the above reference as well as many other common resist formulations commercially available and well known to those skilled in the art. These layers may be coated individually on separate supports and then laminated together, or sequentially coated or extruded on top of each other and then coated or laminated on the support films or by other techniques well known to those skilled in the art. By applying so-called "subbing" layers to the supports, one can make either support have a tendency to adhere to a stronger degree to the contiguous layer than the other.

Examples of binder or matrix compositions useful for the ultraviolet radiation-absorbing layer are as follows:

| Chemical Composition | Molecular Weight | Viscosity (cps in Soln. Shown at 25° C) | Melting Point (° C) |
| --- | --- | --- | --- |
| Polystyrene Resin | 1500 | 800 (46% toluene) | 100 |
| Polystyrene Resin | 300–400 | 6000 (80% toluene) | 75 |
| Poly(vinylidene chloride)-acrylonitrile copolymer | — | 80 (20% in methylethylketone) | — |
| Poly(vinyl chloride) | — | 40 (20% in acetone) | — |
| Polyamide (Melt Index of 10 at 225° C) | — | — | 6–15° F |
| Poly(vinyl formal) | 26–34,000 | — | — |
| Poly(vinyl butyral) | 45–55,000 | — | — |
| Cellulose acetate butyrate | — | 98 (15% in benzene) | — |
| 90 mole % methyl methacrylate / 10 mole % methacrylic acid | 30,000 | 2-ethoxyethanol | — |
| Linear γ-methylstyrene resin | — | 10,000 at 300° F (60% in toluene) | — |
| Poly(vinyl chloride-vinyl acetate) copolymer (89.5–91.5 PVC) | — | — | — |
| Poly(vinylchloride)/ maleic acid/vinylacetate copolymer (85–88% PVC; 0.8–1.2 MA; 10% VA) | — | 70 (15% Soln. in toluene) | — |
| Poly(methyl methacrylate)/ methacrylic acid copolymer - pH = 8 | — | 500 (29.5–31.5% in H$_2$O) | — |
| Chlorinated rubber* (Parlon®-S) | — | 17–25 (25% in benzene) | — |
| Poly(vinylpyrollidene) styrene copolymer | — | 1000 (melt viscosity) | — |
| Poly(methyl methacrylate) | 30,000 | 70–1400 (37.5% in toluene) | — |

-continued

| Chemical Composition | Molecular Weight | Viscosity (cps in Soln. Shown at 25° C) | Melting Point (° C) |
|---|---|---|---|
| Poly(vinyl alcohol) 99–100% hydrolyzed | | 55–65 (4% in H₂O at 20° C) | |
| Poly(vinylpyrollidone)-vinyl acetate copolymer | — | 25,000 (melt viscosity) | — |

*30% chlorine (Hercules Chem. Corp.)

Examples of ultraviolet dyes, ultraviolet absorbers and other dyes which can be dispersed in or mixed with the binders described above are listed below:

2,2'-dihydroxy-4-methoxy-benzophenone
4-dodecyloxy-2-hydroxybenzophenone
2,4-dihydroxybenzophenone
hydroxyphenylbenzotriazole
2(2'-hydroxy-5'-methoxyphenyl)benzotriazole
resorcinol-monobenzoate
2-hydroxy-4-methoxybenzophenone
2,2'-dihydroxy-4,4'-dimethoxy-benzophenone
2,2',4,4'-tetrahydroxybenzophenone
2-hydroxy-4-methoxy-benzophenone-5-sulfuric acid (also sodium salt of above) ethyl-2-cyano-3,3-diphenylacrylate
2-ethylhexyl-2-cyano-3,3-diphenylacrylate

| | | | |
|---|---|---|---|
| Luxol® Orange | GRL | Color Index #25 | (Solvent Orange) |
| | GS | Color Index #24 | " |
| | R | Color Index #20 | " |
| Plasto® Orange | M | Color Index #21 | " |
| | RS | Color Index #22 | " |
| Oil Orange | | Color Index #12055 | (Solvent Yellow #14) |
| Sudan Orange RA | | Color Index #12055 | (Solvent Yellow #14) |
| Latyl Orange 3R | | Color Index #26 | (Disperse Orange) |
| Capracyl Orange | R | Color Index #26 | (Acid Orange) |
| Luxol® Yellow | G | Color Index #45 | (Solvent Yellow) |
| | T | Color Index #47 | " |
| Plasto® Yellow | GR | Color Index #39 | " |
| | MGS | Color Index #40 | " |
| Oil Yellow | 3G | Color Index #29 | " |
| | N | Color Index #2 | " |
| Sudan Yellow | | Color Index #30 | " |
| Latyl Yellow | 3G | Color Index #54 | (Disperse Yellow) |
| Latyl Orange | NST | Color Index #25 | (Disperse Orange) |
| Capracyl Yellow | N | Color Index #113 | (Acid Yellow) |
| Latyl Yellow | YWL | Color Index #42 | (Disperse Yellow) |
| Capracyl Yellow | NW | Color Index #113 | (Acid Yellow) |
| Capracyl Orange | R | Color Index #60 | (Acid Orange) |
| Bakcar Yellow CY | | Color Index #75 | (Disperse Orange) |
| Yellow | 2G | Color Index #3 | (Disperse Yellow) |
| Primrose Yellow | | Color Index #77603 | (Pigment) |
| Chrome Yellow Light | | Color Index #77603 | " |
| Chrome Yellow Medium | | Color Index #77600 | " |
| Dispersed Manganese dioxide Toluidine Yellow CW | | Color Index #71680 | " |
| Molybdate Orange | | Color Index #77605 | " |
| Dalamar Yellow | | Color Index #11741 | " |
| Green Gold | | Color Index #12775 | " |
| Graphtol Yellow | | Color Index Pigment Yellow #61 | |
| Graphtol Orange | | Color Index Pigment Orange #13 | |
| Victoria Pure Blue BO | | Color Index #42595 | |

This invention will be further illustrated by but is not intended to be limited to the following detailed examples.

EXAMPLE I

The following two solutions were prepared:

| Solution A (for use in Preparing the UV Absorber Layer) | |
|---|---|
| 1600 gm | 15% acrylic hydrosol in water, which is a terpolymer made from 55% methyl methacrylate, 40% ethyl acrylate and 5% acrylic acid, 30% solids by weight with a particle size of 0.01–0.05 microns. |
| 95 gm | Capracyl Yellow NW, Colour Index #113 |
| 95 gm | Capracyl Orange R, Colour Index 60 |

| Solution A (for use in Preparing the UV Absorber Layer) | |
|---|---|
| 35 gm | Bakcar Yellow CY, Colour Index #75 |
| 50 gm | Yellow 2G, Colour Index #3 |
| 1000 gm | Water |

This mixture was stirred for one hour and then the following was added:

| | |
|---|---|
| 20 gm | trimethylolpropane triacrylate |
| 5 gm | concentrated sodium lauryl sulfate (10% in water) |
| 10 gm | 10% water solution of a fluorinated hydrocarbon which possesses the following chemical structure: 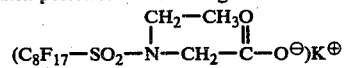 |

| Solution B (for use in Preparing the Photoresist Layer) | |
|---|---|
| 600 gm | Copolymer of methylemethacrylate (90 mole %) and methacrylic acid (10 mole %) |
| 24 gm | o-chlorophenyl-4,5-bis(m-methoxyphenyl) imidazole dimer |
| 12 gm | 4,4'-bis(dimethylamino)benzophenone |
| 72 gm | mixed ester of triethyleneglycol-dicaproate and -dicaprylate |
| 300 gm | trimethylolpropanetriacrylate |
| 200 gm | 2-(2-ethoxy)ethanol |
| 4292 gm | trichloroethylene | biscosity = 16 cps at 25 C using a #1 spindle in the Brookfield Viscometer

Solution A was machine coated on 0.007-inch thick polyethylene terephthalate clear film prepared as described in Example IV of assignee's Alles U.S. Pat. No. 2,779,684, containing a resin sub layer on one side only. Solution A was coated on the resin subbed side using an air knife as known to those skilled in the art. After heating and drying Solution B was coated on top of A in the same nammer and the resulting product laminated with a 0.00075-inch thick, clear, biaxially oriented and heat-set polyethylene terephthalate film to yield a composite element having the structure set forth above, where (1) is the biaxially-oriented and heat-set polyethylene terephthalate film, (2) is the photohardenable layer (from Solution B) about 0.0001-inch in dry thickness, (3) is the UV absorbing layer (from solution A), approximately 0.0001-inch dried thickness and (4) is the resin subbed polyethylene terephthalate base. The finished product was given a 2-minute exposure to a carbon arc (nuArc Xenon lamp, "Flip-Top" Plate Maker Model FT26M-2) at a distance of 18 inches through a test image which was stencil drawing simulating a printed circuit. After stripping off layer (1), the photoresist image formed on (2) was developed in the following solution:

60 ml 2-(2-butoxy)ethanol
2 ml octylphenoxyethoxy ethanol
66.5 gms sodium silicate solution (60% solids in water)
Water to 1 liter This solution not only developed the photoresist image on the photopolymer but also dissolved the polymeric UV-absorbing layer in the identical area under the image producing a yellow colored, exact positive copy of the original which was useful for preparing other copies.

EXAMPLE II

The following two solutions were prepared:

| Solution A | | |
|---|---|---|
| 1000 gm | poly(vinyl acetate) - having a viscosity of 13 to 18 cps as an 8.6% solution in benzene at 20° C. | |
| 60 gm | terpolymer made by reacting 1200 gm methyl methacrylate, 50 gm methacrylonitrile and 500 gm methacryloxypropyltrimethoxysilane which had a molecular weight of 15,700 and an analysis of 1.03% N and 3.15% silicon | |
| 100 gm | trimethylolpropane trimethacrylate | |
| 100 gm | 2,2'-dihydroxy-4-methoxybenzophenone | |
| 100 gm | Luxol ® Fast Yellow-T, Colour Index #47 | |
| 100 gm | ethyl alcohol | |
| 14500 gm | trichloroethylene | |

This solution contained about 7% solids and had a viscosity of 17 cps at 25° C.

| Solution B | |
|---|---|
| 578 gm | Poly(methyl methacrylate)- molecular weight 30,000 |
| 220 gm | poly(methyl methacrylate)- molecular weight 60,000 |
| 95 gm | terpolymer described in "A" |
| 835 gm | trimethylolpropane trimethacrylate |
| 135 gm | triethyleneglycol diacetate |
| 24 gm | o-chlorophenyl-4,5-bis(n-methoxyphenyl)-imidazole dimer |
| 9 gm | 7-diethylamino-4-methylcoumarin |
| 9 gm | 2-mercaptobenzothiazole |
| 1,000 gm | methyl alcohol |
| 7975 gm | methylene chloride |

This solution contained about 17.5% solids. Solution "A" was coated on 0.00092-inch thick, clear, biaxially oriented and heat-set polyethylene terephthalate film. Coating was accomplished by the use of a so-called "doctor" knife. After drying, the film was laminated with 0.001-inch thick polyethylene to protect the resulting UV absorbing layer which had a dried thickness of about 0.0004-inch and the following optical densities, as observed on a Cary Optical Spectrophotometer:

450m$\mu$ = 1.73
400m$\mu$ = 2.59
350m$\mu$ = 3.32
300m$\mu$ = 2.25

This UV absorbing layer was next transferred to a 3 inch $\times$ 4 inch projector slide cover glass, which had been thoroughly cleaned by scrubbing with solvents. Transfer was accomplished by removing the polyethylene cover sheet and laminating said UV layer to said glass plate through heated rollers at 100°-120° C. at approximately 6 ft./min.

Solution B was coated on 0.00075-inch thick, clear biaxially oriented and heat set polyethylene terephthalate base in the same manner. After drying, this photoresist layer, which was about 0.0004-inches thick, was laminated with a polypropylene cover layer to protect the imaging layer during subsequent handling.

The polyethylene terephthalate base sheet was stripped from the UV absorbing layer which had been firmly laminated to the glass and the polypropylene cover layer removed from he photoresist layer and the two layers laminated together as described above, providing a laminated photohardenable element having the structure set forth above, where (1) is polyethylene terephthalate, (2) is the photohardenable layer, (3) is the UV absorbing layer, and (4) is glass.

The photohardenable layer (2) was then given a 10-second exposure at 16 inches with a 1000-watt quartz iodide lamp through a negative containing a standard test pattern comprised of simulated electronic printed circuitry. The polyethylene terephthalate sheet (1) was removed by stripping and the resulting image developed by dipping in a solution consisting of 90% methylisobutylketone/10% isopropanol, followed by a water spray, and the resulting yellow image dried by blowing with compressed air. The solvent used herein dissolved both the unhardened areas of the photoresist and subsequently the dyed, polymeric underlayer leaving a suitable, positive mask on a rigid glass support useful for imaging photoresists with light sensitivity of between 300-450 m$\mu$.

EXAMPLE III

The same compositions outlined in Example II were prepared and coated on their respective substrates as previously described. After stripping off the protective polyethylene cover sheet from the UV absorbing layer (b) it was laminated by the same technique to a piece of clear poly(methylmethacrylate). The photoresist layer was next joined to the UV absorbing layer on the poly(methyl methacrylate), as previously described, to form a composite film element having the structure that is set forth above, where (1) is polyethylene terephthalate, (2) is photoresist, (3) is UV absorbing layer and (4) is poly(methyl methacrylate). A negative test image was exposed through layer (1) on to layer (2) with a six-second exposure to a 1000-watt quartz-iodide lamp at a distance of 16 inches. Layer (1) was removed and the photoresist image developed by spraying with methylchloroform for 30 seconds followed by a second spray of 2-methoxyethanol and a prolonged water spray. The positive yellow image on the rigid poly(methyl methacrylate) support suitable for use as a photomask, was then dried with compressed air.

EXAMPLE IV

Solution A, for use as the UV absorbing layer, was prepared as follows:
2000 gm of the acrylic hydrosol described in Example 1
50 gm 10% sodium lauryl sulfate in water 30 gm 10% water soltuion of a fiuorinated hydrocarbon (as described in Example I).

This slurry was heated to 35° C. and the mixture shown below was added slowly:

40 gm Latyl Yellow 3G, Colour Index #54
35 gm Luxol ® Fast Orange GS, Colour Index #24
20 gm 2,2'-dihydroxy-4-methoxybenzophenone This material was coated on 0.007-inch thick polyethylene terephthalate clear film subbed, and prepared as described in Example IV of assignnee's Alles U.S. Pat. No. 2,779,684, using a "doctor" knife resulting in a dried coating which was 0.0002-inch thick. Once again, this coating was laminated with a thin sheet of polyethylene to prevent damage to the surface during storage and transfer. After removal of this cover sheet, the photoresist element of Example II was laminated to said UV absorbing layer on the resin-subbed polyester to form a laminated photopolymerizable element having the composite structure that is set forth above, where (1) is polyethylene terephthalate, (2) is photoresist (3) is UV absorbing layer and (4) is resin-subbed polyethylene terephthalate. A negative test image was laid on top of (1), exposed 10 seconds to a 1000-watt quartz iodide lamp at a distance of 16 inches. (1) was stripped off and the photoresist image on (2) developed by spraying for 35 seconds with methyl chloroform followed by a 15-second spray with 2-(2- butoxy) ethanol and a 1-minute spray with water. This development procedure also dissolved the UV absorbing layer in the same area below the image. The resulting orange-yellow image was dried with compressed air. A photohardenable material of the following composition was then prepared:

525 gm poly(methyl methacrylate), mol. wt. 30,000
300 gm poly(methyl methacrylate), mol. wt. 60,000
525 gm trimethylolpropane triacrylate
128 gm triethyleneglycol diacetate
9 gm 4,4'-bis(diethylamino)benzophenone
42.3 gm o-chlorophenyl-4,5-bis(n-methoxyphenyl)-imidazole dimer
2.1 gm tri(4-diethylamino-3-methyl)phenyl methane
500 gm methyl alcohol
7970 gm methylene chloride
Viscosity = 17 cps at 25° C.

This material was coated on 0.00075-inch clear, biaxially oriented and heat-set polyethylene terephthalate film yielding a dried thickness of 0.0003-inch and laminated with a cover sheet of polypropylene. The photohardenable layer and a light sensitivity extending from 300–400 mμ. After removal of the polypropylene cover sheet, this photoresist was laminated to a sheet of anodized aluminum by the hot roller technique described in Example II. The photomask prepared above was then laid on top of the polyethylene terephthalate cover film and exposed 5 seconds at 16 inches using the 1000-watt quartz iodide source. After stripping the polyethylene terephthalate film off the photoresist image was developed by spraying with methyl chloroform for 30 seconds and water for 1 minute. The anodized aluminum was etched in those areas where the photoresist layer had been removed by dipping in a 10% aqueous sodium hydroxide solution leaving an exact replica of the photomask firmly etched on said aluminum plate.

EXAMPLE V

Solution A, for use as the UV absorbing layer, was prepared as follows:

100 gm 5% poly(vinylacetate) in water (viscosity is 55–65 cps at 20° C. using the Hoeppler falling ball method)
1 gm Oil Yellow 3G, Colour Index #29
1 gm Luxol ® Yellow T, Colour Index #47
1 gm 2,2'-dihydroxy-4-methoxybenzophenone
50 ml ethyl alcohol After vigorous stirring this mixture was coated on polyethylene terephthalate clear film prepared and subbed in the manner as described in assignee's Rawlins U.S. Pat. No. 3,443,950 and which has been also coated with a thin anchoring substratum of gelatin (0.5 mg/dm²). After drying, the UV absorbing layer had a thickness of 0.002 inch. The photoresist element of Example II was laminated on top of the dried UV absorbing layer to form a composite photopolymerizable film having the structure that is set forth above, where (1) is polyethylene terephthalate, (2) is photoresist, (3) is UV absorber layer and (4) is gel-subbed polyethylene terephthalate. A test image was laid on (1) and exposed 30 seconds to a nuArc xenon arc lamp at a distance of 16 inches. Layer (1) was then stripped off and the photoresist image developed by spraying for 25 seconds with methyl chloroform followed by 25 seconds of hot water spray and 15 seconds of cold water spray. The resultant image, with a dyed underlayer replicate, made an excellent photomask.

EXAMPLE VI

Solution A, for use as the UV absorbing layer, was prepared as follows:

2000 gm 15% acrylic hydrosol (described in Example I)
35 gm Dalamar Yellow, Colour Index #11741
0.5 gm sodium laurylsulfate
0.05 gm Victoria Pure Blue BO, Colour Index #42595
1.5 gm 2,2'-dihydroxy-4-methoxybenzophenone
5 gm trimethylolpropane triacrylate This solution was stirred for two hours and coated on 0.007-inch polyethylene terephthalate resin-subbed base described in Example III to a dry thickness of 0.002-inch. This material had an optical density of 5–7 between 300 and 500 mμ. A photoresist slurry was then prepared which had the following composition:

5 gm poly(methyl methacrylate) mol. wt. 30,000
1 gm triethyleneglycol diacetate
3 gm trimethylolpropane triacrylate
0.1 gm benzophenone
0.1 gm 4,4'-bis(dimethylamino)benzophenone
1 gm ethyl alcohol
methylenechloride to 50 gm.

This solution was coated on 0.00075-inch-thick polyethylene terephthalate and then laminated to the UV absorbing layer, as previously described, yielding a composite photohardenable film having the structure that is set forth above, where (1) is polyethylene terephthalate, (2) is the photoresist, (3) is the UV absorbing layer, and (4) is resin-subbed polyethylene terephthalate. This sandwich was exposed 5 seconds to a SG-60 Sun Gun (1000-watt) at a 16-inch distance through a photographic, silver halide negative test image laid on top of layer (1). Layer (1) was stripped off and the photoresist image developed by spraying for 10 seconds with chloroform. A 25-second spray with 2-ethoxyethanol followed by a 1 minute water wash completed the development and removed that area of the UV layer under the unexposed region of the photoresist that had already been dissolved. After drying, the green colored positive was used to expose the following light-sensitive materials:

1. A photopolymer printing plate described in assignee's Alles U.S. Pat. No. 3,458,311 was exposed through this mask for 45 sec. at 36 inches under the stand-up carbon arc. The line and halftone pattern was developed with the developer composition disclosed in the above reference and a suitable printing plate was obtained.
2. The following "tacky" photopolymer system was prepared:
   40.2% poly(methyl methacrylate), mol. wt. 30,000
   50.2% polyoxyethylated trimethylolpropane triacrylate
   5.6% poly(oxyethylene)lauryl ether
   0.16% 2-mercaptobenzothiazole
   0.16% 7-diethylamino-4-methylcoumarin
   1.6% o-chlorophenyl-4,5-bis(m-methoxyphenyl)-imidazole dimer
   25% solids in trichloroethylene This material was coated to a dry thickness of 0.0004-inch on resin subbed polyethylene terephthalate and overcoated by laminating a 0.00075-inch thick polyethylene terephthalate sheet on top. The photomask was imaged on this material by exposure to the xenon arc for 15 seconds at 18 inches. The image, which is formed by the hardening of the tacky polymer in the area which was exposed, was developed after removal of the polyethylene terephthalate cover sheet by dusting with a dry, colored dye which adhered to those tacky portions. This material is described in assignee's Heiart, U.S. Pat. No. 3,307,943. The resultant dyed image was transferred to coated paper stock by lamination at 110° C. and an excellent positive copy of the photomask was thus secured. A moderately slow, ortho-sensitive silver halide film (mainly chlorobromide with small amounts of iodide) was exposed for 10 seconds to the same photomask using a General Electric 100-watt, 20-volt standard incandescent lamp at a distance of 53 inches through a 0.6 neutral density filter and a #47 Wratten filter. The image was developed in a standard multi-process type developer (metolhydroquinone) followed by fixing in a conventional photographic fixer, washed and dried as known to those skilled in the art. A very high resolution black and white image was obtained.

EXAMPLE VII

A slurry for use as the UV absorbing layer was prepared by placing the following components in a ballmill mixer:
   500 gm 15% acrylic hydrosol (same as material described in Example I)
   50 gm 10% aqueous saponin solution
   30 gm Latyl Yellow YWL, Colour Index #42
   8 gm Latyl Orange NST, Colour Index #25
   10 gm trimethylolpropane triacrylate
   25 gm Cymel ® (urea-formaldehyde copolymer produced by American Cyanamid Co.)
   5 gm 2,2'-dihydroxy-4-methoxybenzophenone After mixing for 16 hours, the slurry as filtered through felt and coated to a dried thickness of 0.002-inch on polyethylene terephthalate resin subbed as described in Example IV. The film was then heated to coalesce the polymer upon which a transparent, orange colored film was obtained which exhibited the following optical densities as measured on a Cary Spectrophotometer:

| Wavelength (mμ) | Optical Density |
| --- | --- |
| 500 | >4.52 |
| 400 | >4.52 |
| 350 | >2 |
| 300 | >2 |

The photoresist element described in Example II was then laminated to this layer in the same manner and exposure-development carried out as described in that Example. This mask material was useful for imaging photoresist clad copper circuit boards.

EXAMPLE VIII

The following two solutions were prepared: Solution A (for use in preparing the ultraviolet absorbing layer) The same as described in Example I.

| Solution B (for use in preparing the photoresist layer) | |
| --- | --- |
| Poly(methyl methacrylate/methacrylic acid) 90/10 mole ratio | 53.8 per cent |
| Pentaerythritol triacrylate containing 0.4% of p-methoxyphenol as thermal inhibitor | 44.1 per cent |
| Tertiary-butylanthraquinone | 2.0 per cent |
| Ethyl Violet (CI Basic Violet 4) Dye | 0.1 per cent |

The above are represented as percentages of a solution (containing 20% solids) in methyl ethyl ketone/isopropanol 3/1.

Solution A was coated on 0.007-inch-thick polyethylene terephthalate as described in Example I and dried. Solution B was then coated on top of A to a coating weight of approximately 87 mg/dm$^2$ solids and dried. This composition was then overcoated with a 3% aqueous solution of polyvinyl alcohol (medium viscosity, 99% saponified) containing 2% of a polyoxyethylene surfactant as disclosed in Alles, U.S. Pat. No. 3,458,311, Example I. The resulting, dried polyvinyl alcohol coating weight was 12 mg/dm. The composite coating was then given a 30-second exposure to a nuArc "flip top" Plate Maker, Model FT 26M-2 stand-up carbon arc through a test image simulating an integrated electrical circuit at a distance of 17 inches and the resulting photoresist image developed using a developer of the following composition:

| Isopropyl alcohol (99%) | 10% by volume |
| --- | --- |
| Sodium hydroxide | 0.1% by weight |

The plate was covered by the developer and allowed to soak for 30 seconds. The entire protective layer, along with the unexposed areas of the photohardenable layer and the dyed polymer layer underneath the corresponding areas was removed by sponging. The developed plate was rinsed in water and dried and a yellow colored copy of the original produced which was suitable for use as a mask.

The advantages and usefulness of this invention for producing photomasks and the like over that of the prior art should be obvious to one skilled in the art from the examples given. Masks of originals with great fidelity can be easily prepared by this system. They may be handled while processing in safelights which are agreeably bright to the human eye which facilitates production. Because of the nature of the invention, and mainly due to the ease with which polymer (UV absorbing layer) and photopolymerizable layer can be made, the formation of pin-holes is prevented. This is a common and undesirable defect of silver halide systems.

In addition, applicant's novel elements are resistant to scratching and abrasive markings which ruin masks like the metal type described previously. Advantageously, dyes and colorants added to the UV absorbing layer can be controlled to attain just the optical density needed for further copy preparation. When it is necessary for the technician to use more than one mask to make a copy, the image is clearly visible under safelights used during photopolymerization, resulting in perfect registry. An important commercial advantage is that the use of applicant's novel composite elements and processes requires less handling of the photopolymerizable elements in making masks.

It is not essential to provide the element layers of this invention interposed between a support and cover sheet. Other modifications can be made, for example, by providing the polymer layer (3) with sufficient thickness so that a portion of that layer can be thermally hardened to provide support for the element. Moreover, removal of the cover sheet or protective layer can provide a practical system. The modifications described and shown are preferred.

EXAMPLE IX

Solution A (the UV absorber layer) was prepared and coated on 0.007 inch thick polyethylene terephthalate film as described in Example I. A cross-linkable isoprene resist which has been identified by W. L. Hunter and P. N. Crabtree and reported in Photographic Science and Engineering, Vol. 13, No. 5, p. 271 (1969) (sold by Eastman Kodak Company as "Kodak Thin Film Resist") was coated on top of the dried UV absorber layer using a 0.002 inch doctor knife. After drying the resist layer at 100° F. for 2 minutes, it was exposed to a test image as described in Example I and the resulting product developed in a xylene based developer furnished by the manufacturer of the resist formulation (Eastman Kodak Co. "Metal Etch Resist Developer") by soaking for 10 minutes at room temperature. The plate was then rinsed in a 50/50 mixture of ethyl alcohol and water. The resulting mask which was produced was suitable for preparing other copies.

EXAMPLE X

Solution A of Example I (for the UV absorber layer) was prepared and coated as in Example IX and dried. The following photosensitive mixture was then coated on top using a 0.002-inch doctor knife:
10 gm. photographic grade gelatin
90 gm. distilled water
5 gm. potassium dichromate
5 gm. 10% aqueous saponin solution The gelatin was dissolved in the water by soaking at 100° F. and the potassium dichromate and saponin then added slowly with stirring. After coating this mixture on the UV absorber layer above, the coating was dried with warm air and the resulting plate given a 5 minute exposure through the test image using the same exposure conditions and light source as in Example I. The exposed film was then developed by soaking 30 seconds in the following solution:
9.6 g.m. sodium borate decahydrate
2.0 g.m. 10% octylphenoxy ethanol in water
180.0 g.m. 2-(2-butoxy ethanol)
Water to 1 liter The developed image was then rinsed in cold water and dried. A yellow copy of the original, opaque to radiation between 200-500 m$\mu$, and suitable for use as a mask of the original remained.

EXAMPLE XI

Solution A (the UV absorber layer) was prepared and coated as described in Example IX. A cross-linkable, photosensitive composition containing a bis-diazonium salt in a macromolecular organic polymer binder as described in assignee's Roos, U.S. Ser. No. 89,133, now U.S. Pat. No. 3,778,270, filed Nov. 12, 1970, Example II was next prepared and coated on top of the dried UV absorber layer. A test image was then placed on the dried, photosensitive layer and exposed and developed as described in Example II of that reference. The solvent used to wash out the exposed areas of the photosensitive composition also removed the same areas of the UV absorber layer leaving a positive image of the original which was suitable for use as a photomask for imaging subsequent copies.

EXAMPLE XII

Solution A (the UV absorber layer) was prepared, coated and dried as in Example IX. A diallyl isophthalate prepolymer was then made according to the method of M. N. Gilano as outlined in U.S. Pat. No. 3,376,139, Apr. 2, 1968. This photosensitive prepolymer was then dissolved in methyl isobutyl ketone (about 5:1 solvent:-prepolymer) and sensitized by adding 4,4'-bis(dimethylamine)benzophenone (0.01 gm. of the sensitizer per 6.5 g.m. solution). The resulting solution was spray coated on top of the above UV absorber layer and dried. The dried layer was about 0.0001-inch thick. The test image was then laid on top of this element and exposed as in Example I and the resulting product developed by soaking for 30 seconds in 1,1,1-trichloroethane. A colored copy of the original was obtained which was suitable for preparing further copies.

EXAMPLE XIII

The following solution was prepared:
Copolymer of ehtyl acrylate (ca. 88%) and acrylic acid (ca. 12%)* - 100 g.m.
NH$_4$OH solution (Saturated, approx. 58% NH$_3$) - 12 g.m.
Distilled water - 888 g.m.

This copolymer is a thermoplastic acrylic polymer, molecular weight approximately 260,000 and containing a number of carboxylic acid groups. The NH$_4^{\oplus}$ salt formed in the above solution has a tensile strength of 4100 PSI.

50 gm. of this solution was mixed with 50 gm. of the acrylic hydrosol described in Example I plus 5 gms. of 25% water solution of a fluorinated hydrocarbon having the following chemical structure:

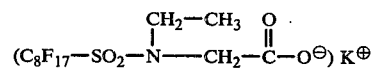

Then, 10 gms of solid potassium permanganate were added and the mixture stirred for 2 hours until all gas evolution ceased. 10 ml. of 2-(2-ethoxy ethanol) was added and the solution coated on 0.007 inch thick polyethylene terephthalate film as in Example I using a 0.002 inch doctor knife to yield a dry coating weight of 50 mg/dm$^2$. This structure was then overcoated with the photosensitive resist formulation of Example I (Solution B) and laminated, exposed to a test image and developed in the same manner as described in Example I. The brown, MnO₂ copy of the original image absorbed strongly between 200–550 mμ and was a useful mask-copy of the original.

EXAMPLE XIV

The following two solutions were prepared:

| Solution A (for use in preparing the UV Absorber Layer) | |
|---|---|
| 220 gm. | methylene chloride |
| 25 gm. | Styrene Maleic Anhydride, Molecular Weight = 1900, Melting Point = 135–150° C., Acid No. 220, Viscosity (15% aq. soln.) = 25 cps. Styrene/Maleic Acid Ratio = 2/1 |
| 11 gm. | Poly(methyl methacrylate)/Methacrylic acid copolymer, pH8, viscosity 500 cps, 29.5 to 31.5% solution in water at 25° C. |
| 16 gm. | Carbon Black (from a preparation consisting of 9600 gm. methylene chloride, 780 gm. furnace black*, 780 gm. poly(methyl methacrylate)/methacrylic acid copolymer, pH8, viscosity 500 cps, 29.5 to 31.5% solution |

*Sterling R Black, 75μm particle size, 25 m²/gm. surface area.

| Solution B (for use in preparing the Photoresist Layer) | |
|---|---|
| 250 gm. | methylene chloride |
| 37 gm. | Poly(methyl methacrylate)/Methacrylic acid copolymer, pH8, viscosity 500 cps. 29.5 to 31.5% solution in water at 25° C |
| 1.6 gm. | 4,4'-bis(dimethylamino) benzophenone. |
| 2.4 gm. | o-chlorophenyl-4,5-bis(m-methoxyphenyl) imidazole dimer |
| 21 gm. | trimethyleneglycoldiacrylate |
| 0.8 gm. | 2,2'-dihydroxy-4-methoxy-benzophenone |

Solution A was machine coated on 0.004 inch thick polyethylene terephthalate clear film prepared as described in Example IV of Alles U.S. Pat. No. 2,779,684, containing a resin sub layer on one side only. Solution A was coated to a dry thickness of 0.0006 inches (about 15 microns) thick and the resulting coating had an optical density of 2.1. Solution B was coated in a like manner on 0.002 inch thick biaxially oriented polyethylene terephthalate film to a dry thickness of about 0.0019 inches (about 48 microns) and the resulting coating had an optical density of 1.8. The two coatings were laminated together using a hot roll laminator at 100° C. at 6 feet per minute lamination speed to yield a composite element having the structure set forth in the specification where (1) is the biaxially oriented polyethylene terephthalate film, (2) is the photohardenable layer (from Solution B), (3) is the UV absorbing layer (from Solution A) and (4) is the resin subbed polyethylene terephthalate film. The composite product thus obtained was equilibrated for about 1 week and then exposed for 1 min. 30 seconds in the manner described in Example I. One sample was exposed through (1) and another through (4) using a test image comprising a $^6\sqrt{2}$ step wedge. After exposure, film (1) was stripped off both samples and the image developed by soaking in a developer comprising 2% NaHCO₃ and 1% Na₂CO₃ in water for 45 seconds at 80° F. The resulting images were then rinsed with water at 72° F. for about 1 minute. The sample exposed through (4) yielded an image with a long grey scale with increasing thickness of relief for each step exposed. This element was useful as a makeready foil for example. The element exposed through (1) had no relief image but was useful as a photomask.

EXAMPLE XV

The following two solutions were prepared:

| Solution A | |
|---|---|
| 108 gm. | Trimethylolpropane triacrylate |
| 143 gm. | Ethylene glycol monoethyl ether |
| 240 gm. | 25% water solution of a fluorinated hydrocarbon having the following chemical structure: |

$$(C_8F_{17}-SO_2-N-CH_2-\overset{CH_2-CH_3O}{\underset{|}{C}}-O^{\ominus})K^{\oplus}$$

| | |
|---|---|
| 123 gm. | 7-diethylamino-4-methyl-coumarin |
| 34 gm. | 2,2'-dihydroxy-4-methoxy-benzophenone |
| 550 gm. | water |
| 3930 gm. | 15% acrylic hydrosol in water (see Example I). |
| 1210 gm. | An aqueous dispersion of poly(methylmethacrylate), about 38% solids, pH 9.6–10.0, Viscosity 10 cps in H₂O at 25% (Rhoplex® B-85, Rohm & Haas). |
| 2495 gm. | Yellow 2 G (Colour Index #3) |
| 173 gm. | Blue 3G (phthalocyanine pigment, Inmont-Blue 3G) |

| Solution E | | |
|---|---|---|
| 1585 | gm. | Trichloroethylene |
| 25 | gm. | 15% acrylic hydrosol in water (see Example I). |
| 5.9 | gm. | tri-(4-diethylamino-o-tolyl)methane |
| 392 | gm. | ethylene glycol monobutyl ether |
| 1.6 | gm. | leuco crystal violet |
| 148 | gm. | 90 mole % methyl methacrylate, 10 mole % methacrylic acid, Mol. Wt. 30,000 |
| 164 | gm. | trimethylolpropane triacrylate |
| 5.6 | gm. | Mixed ester of triethylene glycol-dicaproate and -dicaprylate |
| 10.4 | gm. | 4,4'-bis(dimethylamino) benzophenone |
| 29.4 | gm. | o-chlorophenyl-4,5-bis(m-methoxyphenyl) imidazole dimer. |

Solution A was coated to a dry thickness to 0.00025 inches on the resin subbed side of a 0.004 inch thick polyethylene terephthalate film base (see Example I) and had an optical density of more than 4.0. Solution B was then overcoated thereon to a dry thickness of 0.00025 inches. This material, when coated separately, had an optical density of 2.5. The doubly coated material was then laminated with a 0.0001 inch thick biaxially oriented polyethylene terephthalate cover film to yield a composite element where (1) is the cover film, (2) is the photohardenable layer, (3) is the UV absorber layer and (4) is the resin subbed polyethylene terephthalate. After aging about 1 week two samples of this composite element were then exposed for 1 min. as described in Example I. One sample was exposed to a $^6\sqrt{2}$ step wedge through (4) and the other through (1). The cover sheet (1) was stripped therefrom and the image developed by soaking 1 min. at 70° F. in a solution containing:

10% diethylene glycol nonbutyl ether
1% Na₂CO₃
89% distilled water

The resulting image was rinsed in warm water for about 1 minute. The product exposed through (4), the support film, had a long grey scale and a good relief image and was useful as a makeready foil, for example. The product exposed through (1), the cover film, had no relief image thereon and only a short grey scale.

What is claimed is:

1. A composite mask-forming photohardenable element which is essentially transparent to actinic light in the visible region of the spectrum comprising in successive intimate surface contact:

(a) a cover sheet,
(b) a resist layer, photohardenable by exposure to actinic radiation and soluble in a solvent which will not dissolve the layer in its hardened state;
(c) a separate and distinct solvent-soluble macromolecular organic polymer layer containing at least one ultraviolet absorbing dye or pigment, said polymer layer having an optical density of at least 1.5 to ultraviolet radiation and being soluble in a solvent which will not dissolve said resist-forming layer in its hardened state, and
(d) a support film, one of said layers being selectively more adherent to said support film or said cover sheet, and each of said layers adhering strongly enough to the other to resist rupture when said support film or said cover sheet is stripped from a contiguous surface of one of said layers.

2. The composition of claim 1 wherein said resist layer is an addition polymerizable resist layer.

3. An element according to claim 1 wherein said resist layer is a uniformly crosslinkable, resist layer.

4. An element according to claim 4 wherein said resist layer is a uniformly crosslinkable diazo resist-forming layer.

5. The element of claim 1 wherein both said resist-forming layer and said macromolecular organic polymer layer contain at least one ultraviolet absorbing dye or pigment.

6. An element according to claim 1 wherein said layers are disposed between and, respectively, adhered to a cover support and a support film.

7. An element according to claim 1 wherein said resist layer contains at least one addition polymerizeable monomer containing at least a methacrylic group and a polymeric binder.

* * * * *